(12) United States Patent
Lee (10) Patent No.: US 9,018,539 B2
(45) Date of Patent: Apr. 28, 2015

(54) PRINTED CIRCUIT BOARD AND METHOD FOR MANUFACTURING THE SAME

(75) Inventor: Han Ul Lee, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 178 days.

(21) Appl. No.: 13/487,909

(22) Filed: Jun. 4, 2012

(65) Prior Publication Data

US 2013/0146349 A1    Jun. 13, 2013

(30) Foreign Application Priority Data

Dec. 7, 2011    (KR) .................. 10-2011-0130378

(51) Int. Cl.
*H05K 1/11*    (2006.01)
*H05K 3/36*    (2006.01)
*H05K 3/00*    (2006.01)

(52) U.S. Cl.
CPC .............. *H05K 1/115* (2013.01); *H05K 3/0035* (2013.01); *H05K 2201/09845* (2013.01); *H05K 2203/1476* (2013.01); *Y10T 29/49126* (2015.01)

(58) Field of Classification Search
USPC ............................................ 174/262; 29/830
See application file for complete search history.

(56) References Cited

U.S. PATENT DOCUMENTS 7,674,362 B2 *    3/2010   Hu .................................. 205/125
2009/0308647 A1   12/2009  Liao

FOREIGN PATENT DOCUMENTS

| KR | 10-2007-0082537 | 8/2007 |
| KR | 10 2007 0082537 A * | 8/2007 | ............... H05K 3/42 |
| KR | 10-2010-0043997 | 4/2010 |
| KR | 10-2010-0060406 | 6/2010 |
| KR | 10-2010-0062597 | 6/2010 |
| KR | 10-2011-0057799 | 6/2011 |

OTHER PUBLICATIONS

Korean Notice of Allowance issued Apr. 19, 2013 for corresponding Korean Application No. 10-2011-0130378.

* cited by examiner

*Primary Examiner* — Timothy Thompson
*Assistant Examiner* — Charles Pizzuto (57) ABSTRACT

The present invention relates to a printed circuit board including: a first circuit pattern formed on a first insulator; a second insulator formed on the first insulator; a second circuit pattern having a pad of which a portion is embedded in the second insulator and a via which penetrates the second insulator to electrically connect the first circuit pattern and the pad; and a third circuit pattern formed on the second insulator, and it is possible to reduce a size of the via without increasing an aspect ratio.

8 Claims, 5 Drawing Sheets

PRINTED CIRCUIT BOARD AND METHOD FOR MANUFACTURING THE SAME

CROSS-REFERENCE TO RELATED APPLICATIONS

This application claims the benefit under 35 U.S.C. Section 119 of Korean Patent Application Serial No. 10-2011-0130378, entitled filed Dec. 7, 2011, which is hereby incorporated by reference in its entirety into this application.

BACKGROUND OF THE INVENTION

1. Field of the Invention

The present invention relates to a printed circuit board and a method for manufacturing the same, and more particularly, to a printed circuit board capable of implementing high-density interlayer connection and a fine circuit by reducing a size of a via, and a method for manufacturing the same.

2. Description of the Related Art

In recent times, miniaturization and technology integration of electronic devices and products have been steadily developed due to advance of the electronic devices and products. In addition, various changes in a manufacturing process of a printed circuit board used in the electronic devices and products are also needed in response to miniaturization and technology integration.

A technical direction for a method for manufacturing a printed circuit board has been developed from a single-sided printed circuit board to a double-sided printed circuit board at an early stage and to a multilayer printed circuit board again. Especially, recently, in manufacturing a multilayer printed circuit board, a manufacturing method, which is called a build-up method, is being developed.

Meanwhile, in a manufacturing process of a printed circuit board, a process of forming various via holes such as an inner via hole (IVH), a blind via hole (BVH), and a plated through hole (PTH) for electrically connecting between a circuit pattern and an electronic element of each layer is needed. In the prior art, a printed circuit board is manufactured by forming a via hole in an insulator, plating the inside of the via hole to form a via, and forming a circuit pattern including a pad on a surface of the insulator when the via for interlayer electrical connection is formed.

However, in order to respond to a demand for high density and thinning of a printed circuit board, high-density interlayer connection and a fine circuit should be implemented by reducing the size of the pad and the via formed under the pad, but when forming a printed circuit board according to the prior art, there is a limitation in reducing the size of the via. That is, when simply reducing the size of the via, there is a difficulty in completely plating the via or processing the small via since an aspect ratio, a ratio of height to size (diameter) of the via, is increased.

In order to overcome this problem, a technology for reducing a size of a via without increasing an aspect ratio is needed. In the prior art, since a thin insulator should be used to uniformly maintain an aspect ratio, there is a limitation on the type of available substrates. Due to this, there is difficulty in developing various products.

Further, a lot of costs and efforts are needed to develop a technology of plating a via and a technology of processing a small via.

SUMMARY OF THE INVENTION

The present invention has been invented in order to overcome the above-described problems and it is, therefore, an object of the present invention to provide a printed circuit board capable of reducing a size of a via while uniformly maintaining an aspect ratio by reducing a thickness of an insulator to reduce a height of the via corresponding to the insulator, and a method of manufacturing the same.

It is another object of the present invention to provide a printed circuit board capable of reducing a height of a via in correspondence to a size of the via by employing a structure in which a portion of a pad electrically connected to the via is embedded in an insulator and a circuit pattern is not embedded in the insulator.

It is still another object of the present invention to provide a method for manufacturing a printed circuit board capable of reducing a height of a via in correspondence to a size of the via by forming an opening, which corresponds to a pad, in an insulator and forming the via under the opening.

In accordance with one aspect of the present invention to achieve the object, there is provided a printed circuit board including: a first circuit pattern formed on a first insulator; a second insulator formed on the first insulator; a second circuit pattern having a pad of which a portion is embedded in the second insulator and a via which penetrates the second insulator to electrically connect the first circuit pattern and the pad; and a third circuit pattern formed on the second insulator.

A lower portion of the pad may be embedded in a surface of the second insulator to uniformly maintain an aspect ratio of the via.

The second circuit pattern may be integrally formed with the third circuit pattern.

A height from a lower surface of the second insulator to an upper surface of the via may be formed lower than a height from the lower surface of the second insulator to a lower surface of the third circuit pattern.

A thickness of the pad may be larger than that of the third circuit pattern.

An area of the pad may be formed to become smaller from the top to the bottom.

A diameter of the via may be formed to become smaller from the center to the outside.

In accordance with another aspect of the present invention to achieve the object, there is provided a printed circuit board including: a first circuit pattern formed on a first insulator; a second insulator formed on the first insulator; a second circuit pattern having a pad formed in the second insulator and a via penetrating the second insulator to electrically connect the first circuit pattern and the pad; and a third circuit pattern formed on the second insulator, wherein a height from a lower surface of the second insulator to an upper surface of the via may be formed smaller than a thickness of the second insulator.

A lower portion of the pad may be embedded in a surface of the second insulator to uniformly maintain an aspect ratio of the via.

The second circuit pattern may be integrally formed with the third circuit pattern.

A thickness of the pad may be larger than that of the third circuit pattern.

Meanwhile, in accordance with still another aspect of the present invention to achieve the object, there is provided a method for manufacturing a printed circuit board including the steps of: forming a first circuit pattern on a first insulator; forming a second insulator on the first insulator; forming a second circuit pattern having a pad of which a portion is embedded in the second insulator and a via which penetrates the second insulator to electrically connect the first circuit pattern and the pad; and forming a third circuit pattern on the second insulator.

The step of forming the second circuit pattern may include the steps of forming a first opening, which corresponds to the pad, in the second insulator and forming a second opening, which corresponds to the via, under the first opening.

The second opening may be formed by primarily processing the second insulator with laser to form the first opening and secondarily processing the second insulator, in which the first opening is formed, with laser.

The step of forming the second circuit pattern may further include the step of forming the pad and the via by filling metal in the first and second openings.

The step of filling metal in the first and second openings may fill metal in the first and the second openings by using one or a combination of electroless plating, electroplating, screen printing, sputtering, evaporation, ink jetting, and dispensing.

The second circuit pattern may be integrally formed with the third circuit pattern.

The step of forming the second circuit pattern may further include the steps of disposing a film layer on the second insulator; forming an open region, which corresponds to the first opening and the third circuit pattern, in the film layer; filling metal in the open region; and removing the film layer remaining on the second insulator.

The step of filling metal in the open region may fill metal in the open region until a thickness of the pad reaches a predetermined thickness.

A lower portion of the pad may be embedded in a surface of the second insulator.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 4 to 12 are cross-sectional views showing a process of manufacturing a printed circuit board in accordance with an embodiment of the printed circuit board, wherein

DETAILED DESCRIPTION OF THE PREFERABLE EMBODIMENTS

The terms or words used in the present specification and claims should not be interpreted as being limited to typical or dictionary meanings, but should be interpreted as having meanings and concepts relevant to the technical spirit of the present invention based on the rule according to which an inventor can appropriately define the concept of the term to describe his/her own invention in the best manner.

Therefore, configurations shown in embodiments and the drawings of the present invention rather are examples of the most exemplary embodiment and do not represent all of the technical spirit of the invention. Thus, it will be understood that various equivalents and modifications that replace the configurations are possible when filing the present application.

Hereinafter, embodiments of the present invention will be described in detail with reference to the accompanying drawings.

Figure 1:
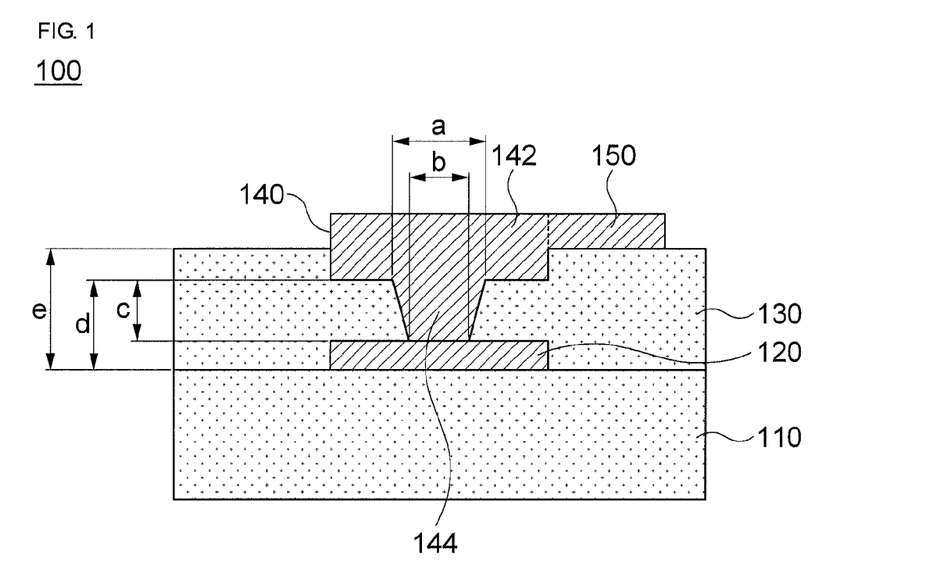
FIG. 1 is a cross-sectional view of a printed circuit board in accordance with an embodiment of the present invention.
Figure 2:
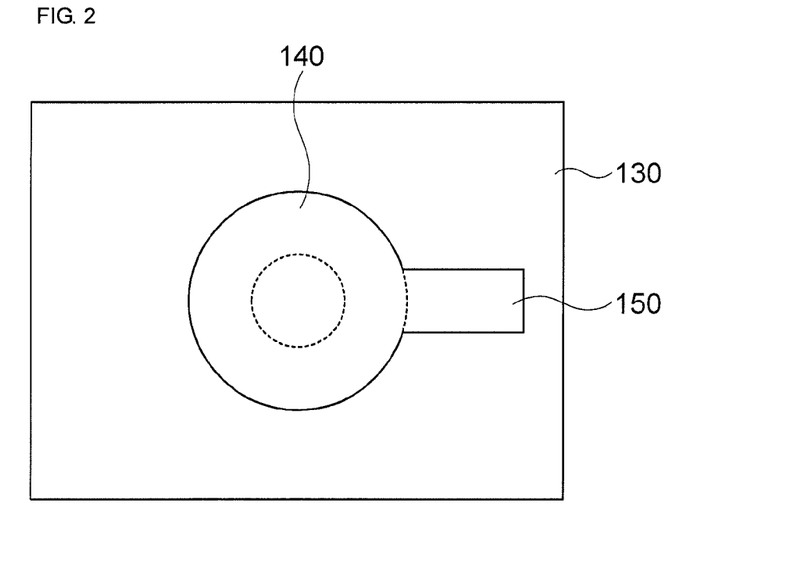
FIG. 2 is a plan view of the printed circuit board shown in FIG. 1.

FIG. 1 is a cross-sectional view of a printed circuit board in accordance with an embodiment of the present invention, and FIG. 2 is a plan view of the printed circuit board shown in FIG. 1.

As shown in FIGS. 1 and 2, a printed circuit board 100 includes a first insulator 110, a first circuit pattern 120, a second insulator 130, a second circuit pattern 140, and a third circuit pattern 150.

First, the first insulator 110 is a means of supporting the printed circuit board 100 and may be made of various materials, which have low electrical conductivity and hardly pass current, such as prepreg, polyimide, polyethyelenetereptha-late (PTE), cyanide ester, Ajinomoto build-up film (ABF), and epoxy.

Here, configuration of the printed circuit board as in FIG. 1 is only an example, the printed circuit board may be a single-sided printed circuit board, a both-sided printed circuit board, or a multilayer printed circuit board, and technical features of the present invention can be equally applied.

The first circuit pattern 120 is a means formed on the first insulator 110, called an inner layer circuit pattern or an inner layer pad, and may be formed by various methods such as a subtractive method, an additive method, and a semi-additive method.

This first circuit pattern 120 may be made of a metal material such as copper (Cu), silver (Ag), gold (Au), aluminum (Al), iron (Fe), titanium (Ti), tin (Sn), nickel (Ni), or molybdenum (Mo).

The second insulator 130 is formed on the first insulator 110 including the first circuit pattern 120 and may be made of various materials, which have low electrical conductivity and hardly pass current, such as prepreg, polyimide, polyethyelene-neterepthalate (PTE), cyanide ester, Ajinomoto build-up film (ABF), and epoxy, like the first insulator 110.

The second circuit pattern 140 may include a pad 142 of which a portion is embedded in the second insulator 130 and a via 144 which penetrates the second insulator 130 to electrically connect the first circuit pattern 120 and the pad 142.

At this time, it is possible to uniformly maintain an aspect ratio of the via 144 by employing a structure in which a lower portion of the pad 142 is embedded in a surface of the second insulator 130. More specifically, in order to respond to a demand for high density and thinning of the printed circuit board, a size of the via 144 should be reduced while uniformly maintaining the aspect ratio (size of via (height (c) of via to diameter (a) of upper surface of via or diameter (b) of lower surface of via=height (c) of via/diameters (a,b) of via)) of the via 144. For this, a height of the via 144 should be reduced as well. Accordingly, in an embodiment of the present invention, it is possible to reduce a thickness of the second insulator 130 by employing a structure in which the pad 142 formed on the via 144 is embedded in the surface of the second insulator 130. Accordingly, it is possible to uniformly maintain the aspect ratio of the via 144 by reducing the height of the via 144.

Further, in order to uniformly maintain the aspect ratio of the via 144, since it is required to reduce only the height of the via 144 in correspondence to the size of the via 144, the third circuit pattern 150, which is not directly connected to the via 144, cannot be embedded in the second insulator 130.

The third circuit pattern 150 is a means formed on the second insulator 130, called an outer layer circuit pattern, and may be formed by using a subtractive method, an additive method, or a semi-additive method, like the first circuit pattern 120.

This third circuit pattern 150 may be made of a metal material such as copper (Cu), silver (Ag), gold (Au), aluminum (Al), iron (Fe), titanium (Ti), tin (Sn), nickel (Ni), or molybdenum (Mo), like the first and second circuit patterns 120 and 140.

And, since the third circuit pattern 150 is formed simultaneously with the second circuit pattern 140 by plating, it can be integrally formed with the second circuit pattern 140.

In addition, since a portion of the pad 142 is embedded in the second insulator 130, a thickness of the third circuit pattern 150 may be formed smaller than that of the pad 142.

Figure 3:
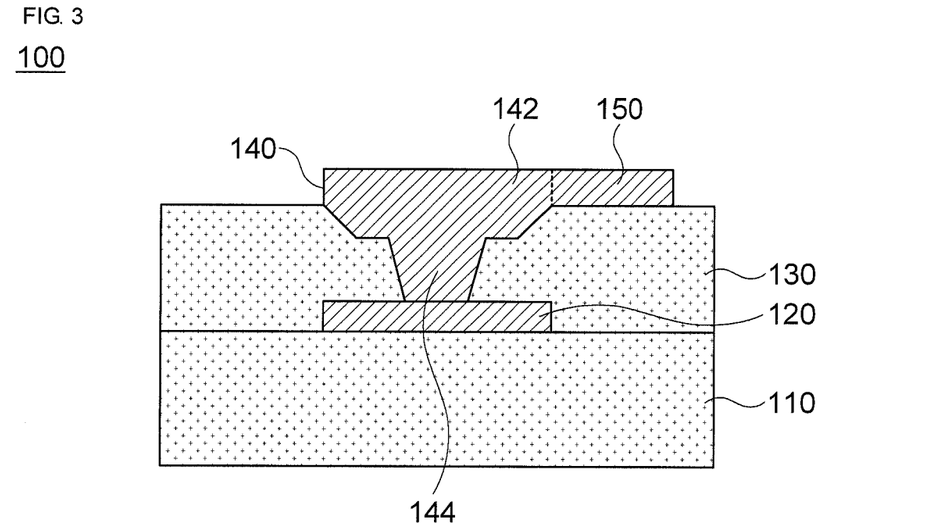
FIG. 3 is a cross-sectional view of a printed circuit board in accordance with another embodiment of the present invention.

FIG. 3 is a cross-sectional view of a printed circuit board in accordance with another embodiment of the present invention. As shown in FIG. 3, a pad 142 may be formed to become smaller from the top to the bottom. That is, the entire pad 142 may be formed to become smaller from the top to the bottom. Otherwise, only a portion of the pad 142, which is embedded in a second insulator 130, may be formed to become smaller from the top to the bottom.

Further, a diameter of a via 144 may become smaller from the center to the outside.

Like this, it is possible to uniformly maintain the aspect ratio of the via 144 by forming a height (d) from a lower surface of the second insulator 130 to an upper surface of the via 144 to be smaller than a thickness (e) of the second insulator 130. Due to this, it is possible to easily implement high density of the printed circuit board.

Further, since the aspect ratio of the via 144 is uniformly maintained, it is possible to minimize plating defects and stably secure plating process capability.

Hereinafter, a process of manufacturing a printed circuit board in accordance with an embodiment of the present invention will be described.

FIGS. 4 to 12 are cross-sectional views showing a process of manufacturing a printed circuit board in accordance with an embodiment of the present invention.

Figure 4:
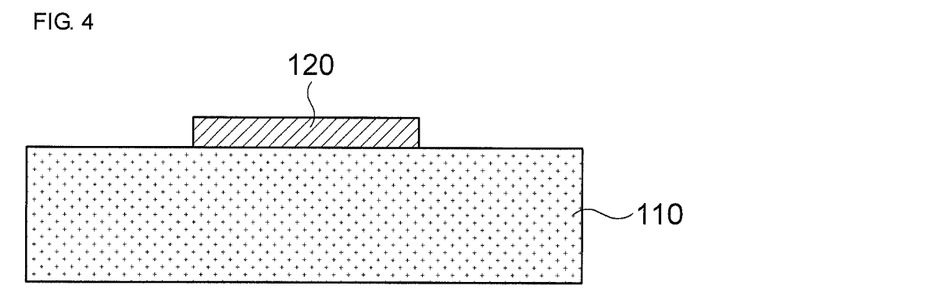
FIG. 4 is a cross-sectional view showing a state in which a first circuit pattern is formed on a first insulator.

As shown in FIG. 4, a first circuit pattern 120 is formed on a first insulator 110. Here, the first insulator 110 is a means of supporting a printed circuit board 100 and may be made of various materials, which have low electrical conductivity and hardly pass current, such as prepreg, polyimide, polyethyelenetherepthalate (PTE), cyanide ester, Ajinomoto build-up film (ABF), and epoxy.

Further, the first circuit pattern 120 is called an inner layer circuit pattern or an inner layer pad and may be formed by various methods such as a subtractive method, an additive method, and a semi-additive method.

This first circuit pattern 120 may be made of a metal material such as copper (Cu), silver (Ag), gold (Au), aluminum (Al), iron (Fe), titanium (Ti), tin (Sn), nickel (Ni), or molybdenum (Mo).

Figure 5:
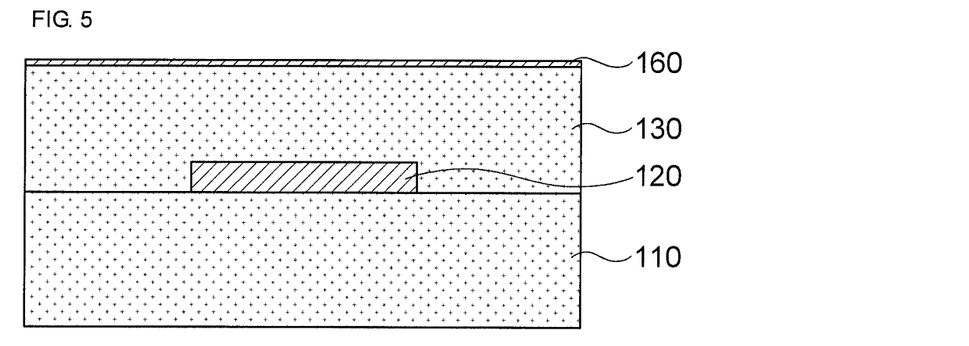
FIG. 5 is a cross-sectional view showing a state in which a second insulator is formed on the first insulator and a seed layer is formed on the second insulator.

And, as shown in FIG. 5, a second insulator 130 is formed on the first insulator 110 including the first circuit pattern 120. At this time, a seed layer 160 may be further formed on the second insulator 130.

Next, a second circuit pattern 140 having a pad 142 of which a portion is embedded in the second insulator 130 and a via 144 which penetrates the second insulator 130 to electrically connect the first circuit pattern 120 and the pad 142 is formed.

Figure 6:
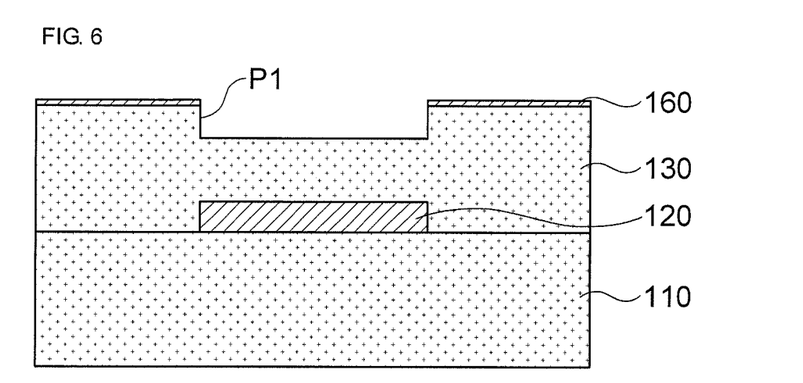
FIG. 6 is a cross-sectional view showing a state in which a first opening corresponding to a pad is formed in the second insulator.

When describing a process of forming the above second circuit pattern in detail, as in FIG. 6, a first opening P1 corresponding to the pad 142 is formed in the second insulator 130. Here, the first opening P1 may be formed by primarily processing the second insulator 130 with laser to remove a portion of the second insulator 130. When the seed layer 160 does not exist and only the second insulator 130 exists, the first opening P1 is formed by directly processing the second insulator 130 with laser. As in FIG. 5, when the seed layer 160 exists on the second insulator 130, the first opening P1 is formed by removing the seed layer 160 first in correspondence to the first opening P1 and processing the second insulator 130 with laser.

At this time, the first opening P1 may be formed in a polygonal or circular shape. In addition, the first opening P1 may be formed in a reversed trapezoid shape or a shape becoming wider toward the bottom.

Figure 7:
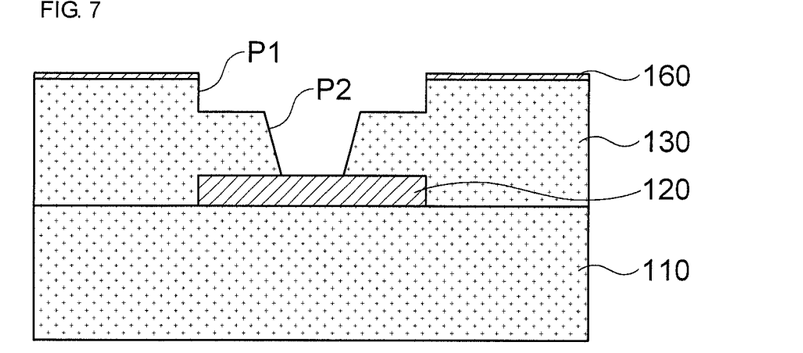
FIG. 7 is a cross-sectional view showing a state in which a second opening corresponding to a via is formed under the first opening.

After that, as in FIG. 7, a second opening P2 corresponding to the via 144 is formed under the first opening P1. At this time, the second opening P2 may be formed by primarily processing the second insulator 130 with laser to form the first opening P1 and secondarily processing the second insulator 130, in which the first opening P1 is formed, with laser.

At this time, the first and second openings P1 and P2 may be formed by various means such as a computer numerical control (CNC) drill or an X-ray drill in addition to various lasers such as ultraviolet (UV) laser and carbon dioxide ($CO_2$) laser that can form a hole.

Figure 8:
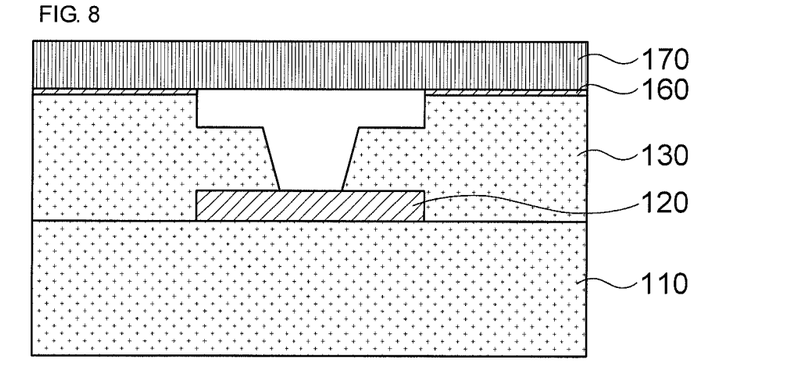
FIG. 8 is a cross-sectional view showing a state in which a film layer is disposed on the second insulator.
Figure 9:
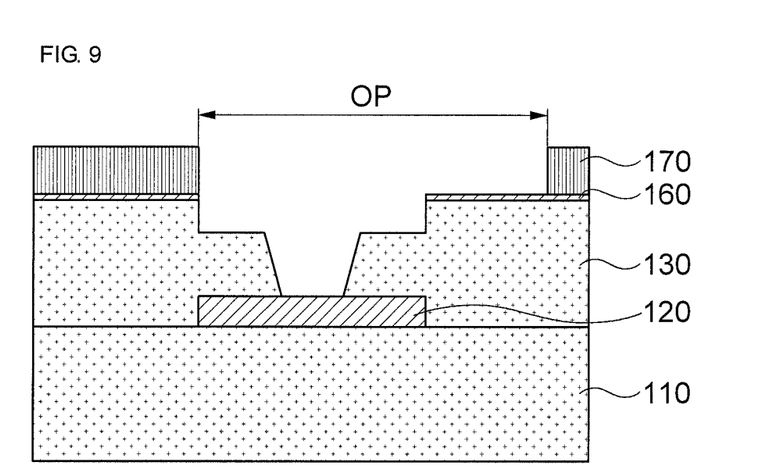
FIG. 9 is a cross-sectional view showing a state in which an open region corresponding to the first opening and a third circuit pattern is formed in the film layer.

Next, as in FIG. 8, a film layer 170 is disposed on the second insulator 130 on which the seed layer 160 is formed, and as in FIG. 9, an open region (OP) corresponding to the first opening P1 and the third circuit pattern 150 is formed in the film layer 170. At this time, the film layer 170 may be made of various photosensitive materials such as photo resist, photo solder resist, and dry film and can be replaced with various materials without being limited to the above materials.

Figure 10:
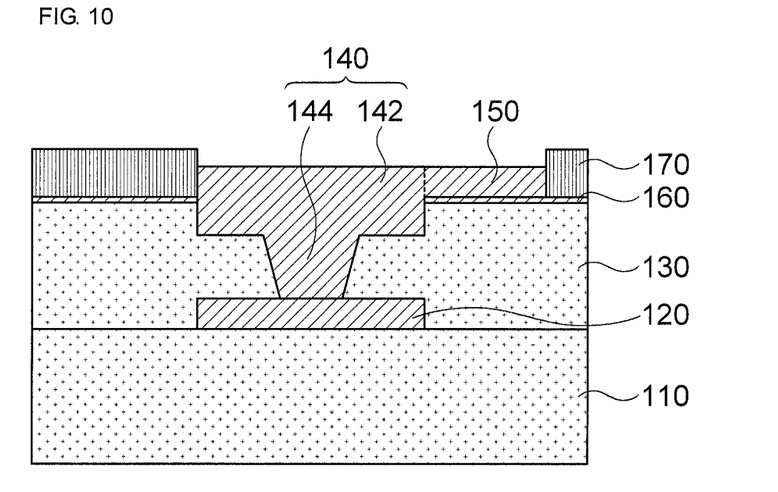
FIG. 10 is a cross-sectional view showing a state in which metal is filled in the open region.

After that, as in FIG. 10, metal is filled in the open region (OP). In order to fill metal in the opening region (OP), one or a combination of electroless plating, electroplating, screen printing, sputtering, evaporation, ink jetting, and dispensing can be used.

Here, an electroless plating method is a method of depositing metal on a surface of an object to be processed by autocatalytically reducing metal ions in a metal salt solution by power of a reducing agent without supply of electrical energy from the outside. This electroless plating method is called chemical plating or autocatalytic plating, and a reaction that the reducing agent in the solution supplies electrons to reduce the metal ions to metal molecules occurs on a surface of a catalyst. Further, the electroless plating method has advantages that it can form a dense plating layer compared to an electroplating method and be applied to various substrates such as plastic or organic substrates as well as conductive substrates.

And, an electroplating method is a method of plating a thin film of another metal on a surface of metal by using a principle of electrolysis, and a sputtering method is a technique of attaching a film to a surface of an object and can be used when forming a thin film or a thick film by evaporating a solid in a high vacuum state in order to make an electronic circuit in a ceramic or semiconductor material.

More specifically, the sputtering method is called a sputtering deposition method and can form a thin film by attaching atoms, a thin film material, to a surface of an object. That is, when the ionized atoms (Ar) are accelerated by an electric field to make a collision with the thin film material, the atoms of the thin film material are sprung out by this collision and the sprung atoms are attached to the surface of the object to form a thin film. In addition to this sputtering evaporation method, various methods such as a thin film evaporation method using evaporation can be used to form a metal layer. In order to deposit a metal layer, the thin film deposition method using evaporation heats a boat using electron beams or electric filaments in a high vacuum ($5\times10^{-5}\sim1\times10^{-7}$ torr) to melt metal on the boat and distills the metal. At this time, the distilled metal is condensed on the cool surface of the object to form metal.

Further, when filling metal in the open region (OP), if plating capability is insufficient, dimples may be generated. When the dimples affect quality of the printed circuit board, the open region (OP) may be filled with metal several times until a thickness of the pad 144 reaches a predetermined thickness.

Figure 11:
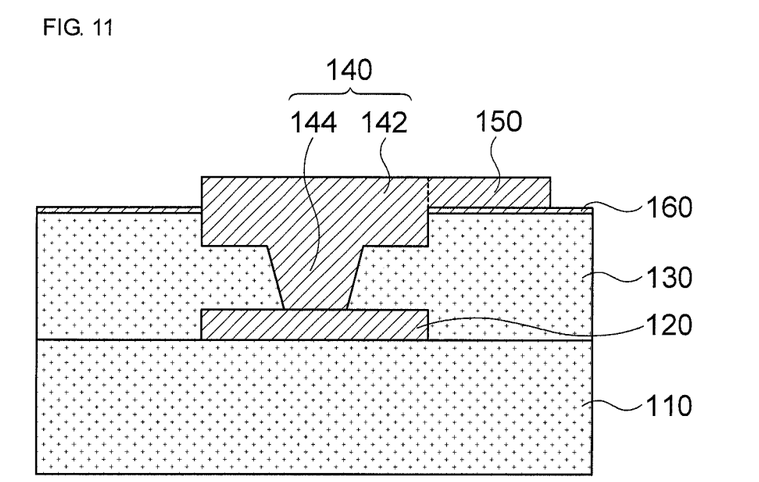
FIG. 11 is a cross-sectional view showing a state in which the film layer is removed.

After that, as in FIG. 11, the film layer 170 remaining on the second insulator 130 is removed.

Figure 12:
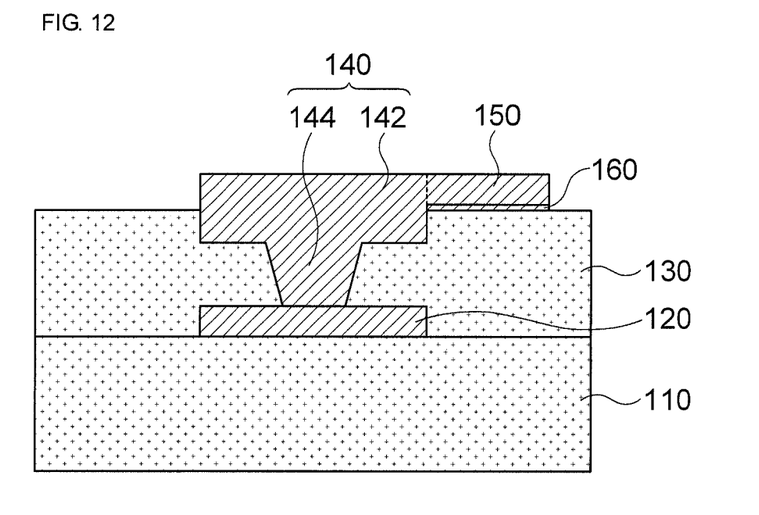
FIG. 12 is a cross-sectional view showing a state in which the seed layer formed on a surface of the second insulator is removed.

After that, as in FIG. 12, the seed layer 160 on a surface of the second insulator 130 is removed by etching.

Like this, it is possible to uniformly maintain an aspect ratio of the via by forming the opening corresponding to the pad in the second insulator and forming the via under the opening to reduce a height of the via according to a thickness of the insulator.

Due to this, it is possible to minimize plating defects, stably secure plating process capability, and implement high-density interlayer connection and fine circuits.

As described above, according to the printed circuit board and the method for manufacturing the same in accordance with an embodiment of the present invention, it is possible to reduce a size of a via while uniformly maintaining an aspect ratio by reducing a thickness of an insulator to reduce a height of the via corresponding to the insulator.

More specifically, it is possible to reduce the size of the via without increasing the aspect ratio by employing a structure in which a portion of a pad electrically connected to the via is embedded in the insulator and a circuit pattern is not embedded in the insulator to reduce the height of the via according to the thickness of the insulator.

Due to this, it is possible to implement a small via in all materials regardless of the thickness of the insulator and save development costs since there is no need for development of a technology of processing or plating a fine via.

Further, since it is possible to uniformly maintain an aspect ratio of a via by forming an opening corresponding to a pad in an insulator and forming the via under the opening to reduce a height of the via according to a thickness of the insulator, it is possible to minimize plating defects and stably secure plating process capability.

In addition, in order to respond to a demand for high density and thinning of a printed circuit board, a size of a pad or a land should be reduced, and in order to reduce the size of the pad or the land, technologies of alignment and reducing a size of a via should be secured. According to the present invention, it is possible to stably manufacture a high specification printed circuit board by remarkably reducing the size of the via to easily secure the technology of alignment.

Accordingly, it is possible to easily implement the high density of the printed circuit board.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A printed circuit board comprising:
a first circuit pattern formed on a first insulator;
a second insulator formed on the first insulator;
a second circuit pattern having a pad, of which a first portion is embedded in the second insulator and of which a second portion is protruded out of the second insulator, and a via which penetrates the second insulator to electrically connect the first circuit pattern and the pad; and
a third circuit pattern integrally formed with the second portion of the pad, and formed on one part of a top surface of the second insulator such that at least a portion of another part of the top surface of the second insulator is exposed out of the third circuit pattern.

2. The printed circuit board according to claim 1, wherein a lower portion of the pad is embedded in a surface of the second insulator to uniformly maintain an aspect ratio of the via.

3. The printed circuit board according to claim 1, wherein a height from a lower surface of the second insulator to an upper surface of the via is formed lower than a height from the lower surface of the second insulator to a lower surface of the third circuit pattern.

4. The printed circuit board according to claim 1, wherein a thickness of the pad is larger than that of the third circuit pattern.

5. The printed circuit board according to claim 1, wherein an area of the pad is formed to become smaller from the top to the bottom.

6. The printed circuit board according to claim 1, wherein a diameter of the via is formed to become smaller from the top to the bottom.

7. The printed circuit board according to claim 1,
wherein a height from a lower surface of the second insulator to an upper surface of the via is smaller than a maximum thickness of the second insulator.

8. A printed circuit board comprising:
a first circuit pattern formed on a first insulator;
a second insulator formed on the first insulator;

a second circuit pattern having a pad, of which a first portion is embedded in the second insulator and of which a second portion is protruded out of the second insulator, and a via which penetrates the second insulator to electrically connect the first circuit pattern and the pad; and a third circuit pattern formed on a part of a top surface of the second insulator, and having an elongated shape of which one end is integrally formed with the second portion of the pad.

* * * * *

UNITED STATES PATENT AND TRADEMARK OFFICE
CERTIFICATE OF CORRECTION

| | | |
|---|---|---|
| PATENT NO. | : 9,018,539 B2 | Page 1 of 1 |
| APPLICATION NO. | : 13/487909 | |
| DATED | : April 28, 2015 | |
| INVENTOR(S) | : Han Ul Lee | |

It is certified that error appears in the above-identified patent and that said Letters Patent is hereby corrected as shown below:

In the Specification

Column 1, Cross-Reference to Related Applications, Line 3, Before "filed" delete "entitled"

Signed and Sealed this
Eighteenth Day of August, 2015

Michelle K. Lee
*Director of the United States Patent and Trademark Office*